(12) United States Patent
Ohishi et al.

(10) Patent No.: US 8,618,497 B2
(45) Date of Patent: Dec. 31, 2013

(54) DRAWING APPARATUS, METHOD OF MANUFACTURING ARTICLE, AND INFORMATION PROCESSING APPARATUS

(71) Applicant: Canon Kabushiki Kaisha, Tokyo (JP)

(72) Inventors: Shinji Ohishi, Oyama (JP); Tomoyuki Morita, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/734,192

(22) Filed: Jan. 4, 2013

(65) Prior Publication Data

US 2013/0175453 A1 Jul. 11, 2013

(30) Foreign Application Priority Data

Jan. 10, 2012 (JP) .................... 2012-002476

(51) Int. Cl.
*G21K 5/04* (2006.01)
(52) U.S. Cl.
USPC ............ 250/396 R; 250/397; 250/492.1; 250/492.21; 250/492.22; 250/492.23; 250/492.3; 250/288; 700/2; 700/3; 700/90; 700/108; 700/109; 702/33; 702/34; 702/40; 702/49; 702/134
(58) Field of Classification Search
USPC ...... 250/396 R, 397, 396 ML, 492.1, 492.21, 250/492.22, 492.23, 492.3; 700/2, 3, 90, 700/108, 109, 110; 702/33, 34, 40, 49, 127, 702/134
See application file for complete search history.

(56) References Cited

U.S. PATENT DOCUMENTS

2013/0063708 A1* 3/2013 Ohishi ........................ 355/53
2013/0177855 A1* 7/2013 Nakada et al. ............... 430/296

FOREIGN PATENT DOCUMENTS

JP 3079514 B2 6/2000

* cited by examiner

*Primary Examiner* — Jack Berman
*Assistant Examiner* — Meenakshi Sahu
(74) *Attorney, Agent, or Firm* — Rossi, Kimms & McDowell LLP (57) ABSTRACT

The present invention provides a drawing apparatus including a plurality of drawing units each of which is configured to perform drawing on a substrate with a charged particle beam, a plurality of first processors configured to be selectively connectable to each of the plurality of drawing units, an information processor configured to determine, from the plurality of first processors, a first processor to be connected to a first drawing unit among the plurality of drawing units, based on drawing data, and a connection unit configured to connect the determined first processor to the first drawing unit.

8 Claims, 8 Drawing Sheets

| DEVICE | MAXIMUM VIEWING ANGLE SIZE 26×33(mm²) | DIE SIZE (mm²) | NUMBER OF DIES WITHIN AREA DEFINED BY VIEWING ANGLE | ACTUAL DRAWING SIZE (mm²) | ACTUAL DRAWING AREA RATIO (%) |
|---|---|---|---|---|---|
| NANDflash(64G) | 858 | 244 | 3 | 732 | 85 |
| NANDflash(32G) | 858 | 172 | 4 | 688 | 80 |
| NANDflash(16G) | 858 | 142 | 6 | 852 | 99 |

DRAWING APPARATUS, METHOD OF MANUFACTURING ARTICLE, AND INFORMATION PROCESSING APPARATUS

BACKGROUND OF THE INVENTION

1. Field of the Invention

The present invention relates to a drawing apparatus, a method of manufacturing an article, and an information processing apparatus.

2. Description of the Related Art

In recent years, with miniaturization and an increase in packing density of the circuit pattern of a semiconductor integrated circuit, a drawing apparatus which draws a pattern on a substrate with a charged particle beam (electron beam) is attracting a great deal of attention. Such a drawing apparatus is required to attain a higher processing capacity per unit time (throughput) to improve the productivity.

Japanese Patent No. 3079514 proposes a drawing system including a plurality of drawing apparatuses, as a method for improving the throughput of a drawing apparatus. In the drawing system described in Japanese Patent No. 3079514, each of the plurality of drawing apparatuses includes a supply unit which supplies drawing data, a drawing controller which controls a charged particle beam based on the drawing data, and a correction processor which corrects the irradiation position of the charged particle beam. Hence, the plurality of drawing apparatuses can simultaneously perform different drawing processes independently of each other.

In the drawing system described in Japanese Patent No. 3079514, the correction processor of each drawing apparatus is provided with correction units in a number required to draw patterns with a maximum drawing size. However, in practice, all drawing apparatuses rarely draw patterns with a maximum drawing size, so some correction units are not used for drawing and wasted. In addition, in a drawing system including a plurality of drawing apparatuses, correction units which are not used for drawing accumulate, so the wasted time and power increase in proportion to the number of drawing apparatuses.

SUMMARY OF THE INVENTION

The present invention provides, for example, a drawing apparatus advantageous in terms of efficient use of a processor for a plurality of drawing units.

According to one aspect of the present invention, there is provided a drawing apparatus including a plurality of drawing units each of which is configured to perform drawing on a substrate with a charged particle beam, the apparatus comprising: a plurality of first processors configured to be selectively connectable to each of the plurality of drawing units; an information processor configured to determine, from the plurality of first processors, a first processor to be connected to a first drawing unit among the plurality of drawing units, based on drawing data; and a connection unit configured to connect the determined first processor to the first drawing unit.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

Figure 2:
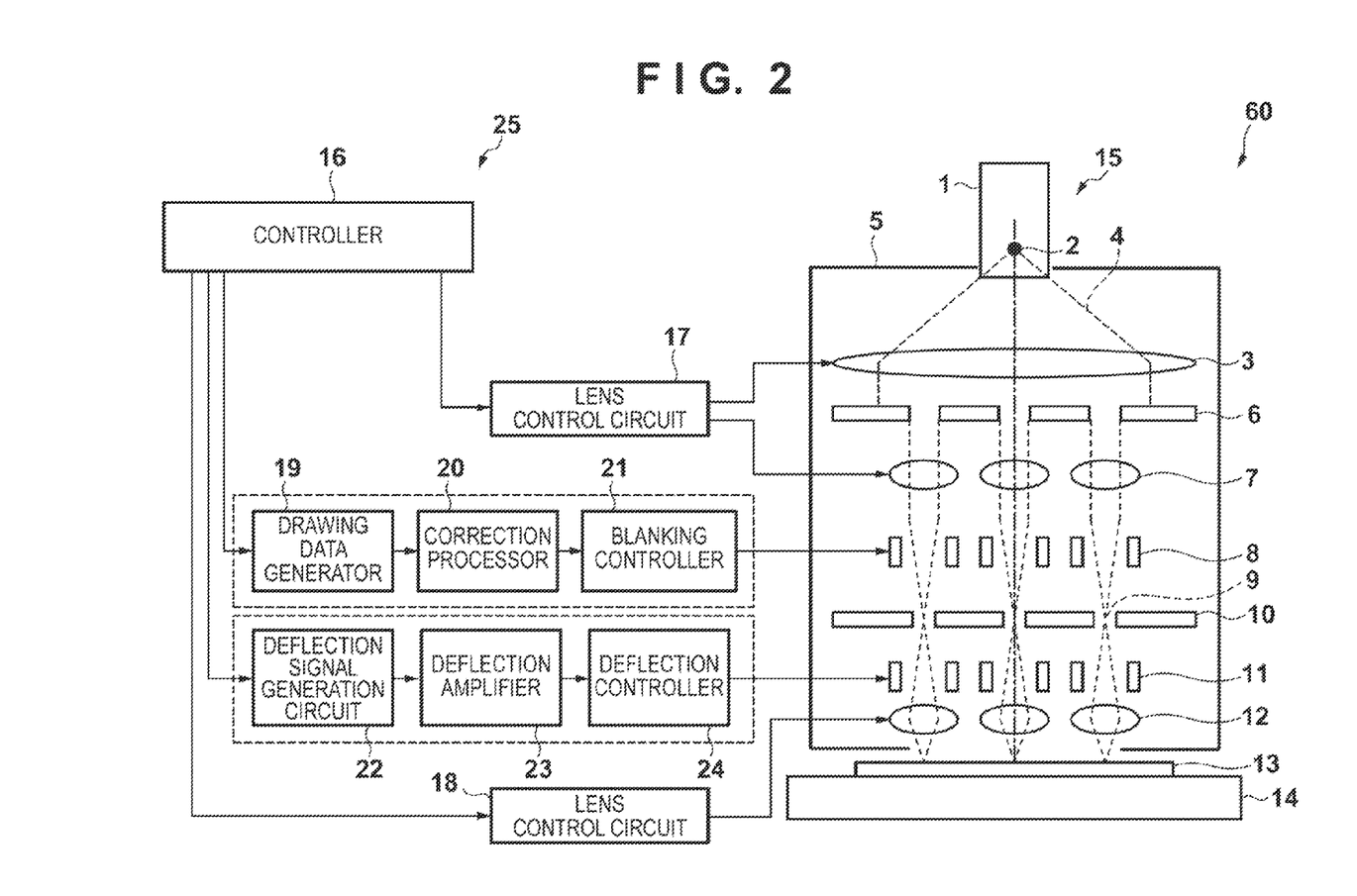
FIG. 2 is an overall view of a charged particle beam drawing system.

A charged particle beam drawing system according to the present invention will be described with reference to FIG. 2. A drawing system 60 which uses a charged particle beam includes a drawing apparatus (drawing unit) 15 which irradiates a substrate with a charged particle beam to draw a pattern on the substrate, and a data processing system 25 which controls each unit of the drawing apparatus 15. Although only one drawing apparatus 15 is shown in FIG. 2, a plurality of drawing apparatuses 15 constitute the drawing system 60.

The drawing apparatus 15 includes a charged particle gun 1, electron optical system 5, and stage 14. The electron optical system 5 includes a collimator lens 3, aperture array 6, first electrostatic lens 7, blanking deflectors 8, blanking apertures 10, deflectors 11, and second electrostatic lens 12.

A charged particle beam 4 emitted by the charged particle gun 1 forms a crossover image 2, is converted into a collimated beam by the action of the collimator lens 3, and is incident on the aperture array 6. The aperture array 6 includes a plurality of circular apertures arrayed in a matrix, and splits the charged particle beam 4 incident as a collimated beam into a plurality of charged particle beams 4. The charged particle beams 4 split upon passing through the aperture array 6 are incident on the first electrostatic lens 7 formed by three electrode plates (these three electrode plates are shown as an integrated electrode plate in FIG. 2) including circular apertures. The charged particle beams 4 having passed through the first electrostatic lens 7 form intermediate images 9 of the crossover image 2, and the blanking apertures 10 formed by arranging small apertures in a matrix are set at the positions at which the intermediate images 9 are formed. The blanking deflector 8 is set in the preceding stage of the blanking aperture 10 for each split charged particle beam 4, and the charged particle beams 4 deflected by the blanking deflectors 8 are blocked by the blanking apertures 10 and do not reach the surface of a substrate 13. That is, the blanking deflectors 8 switch between ON and OFF of the irradiation of the substrate 13 with the charged particle beams 4. The charged particle beams 4 having passed through the blanking apertures 10 form images of the original crossover image 2 on the substrate 13 via the deflectors 11 for scanning the charged particle beams 4 on the substrate 13, and the second electrostatic lens 12. The deflectors 11 desirably deflect the charged particle beams 4 in a direction perpendicular to that in which the stage 14 on which the substrate 13 is mounted is scanned. However, the direction in which the charged particle beams 4 are deflected is not limited to a direction perpendicular to that in which the stage 14 is scanned, and the charged particle beams 4 may be deflected at other angles.

The data processing system 25 includes lens control circuits 17 and 18, drawing data generator 19, correction processor 20, blanking controller 21, deflection signal generation circuit 22, deflection amplifier 23, deflection controller 24, and controller 16. The lens control circuits 17 and 18 control the respective lenses 3, 7, and 12. The drawing data generator 19 generates drawing data based on a pattern to be drawn on the substrate 13. The correction processor 20 corrects the generated drawing data, and inputs it to the blanking controller 21. The deflection signal generation circuit 22 generates a deflection signal, which is input to the deflection controller 24 via the deflection amplifier 23. The blanking controller 21 and deflection controller 24 control the blanking deflectors 8 and deflectors 11, respectively. The controller 16 controls all drawing operations.

Figure 3:
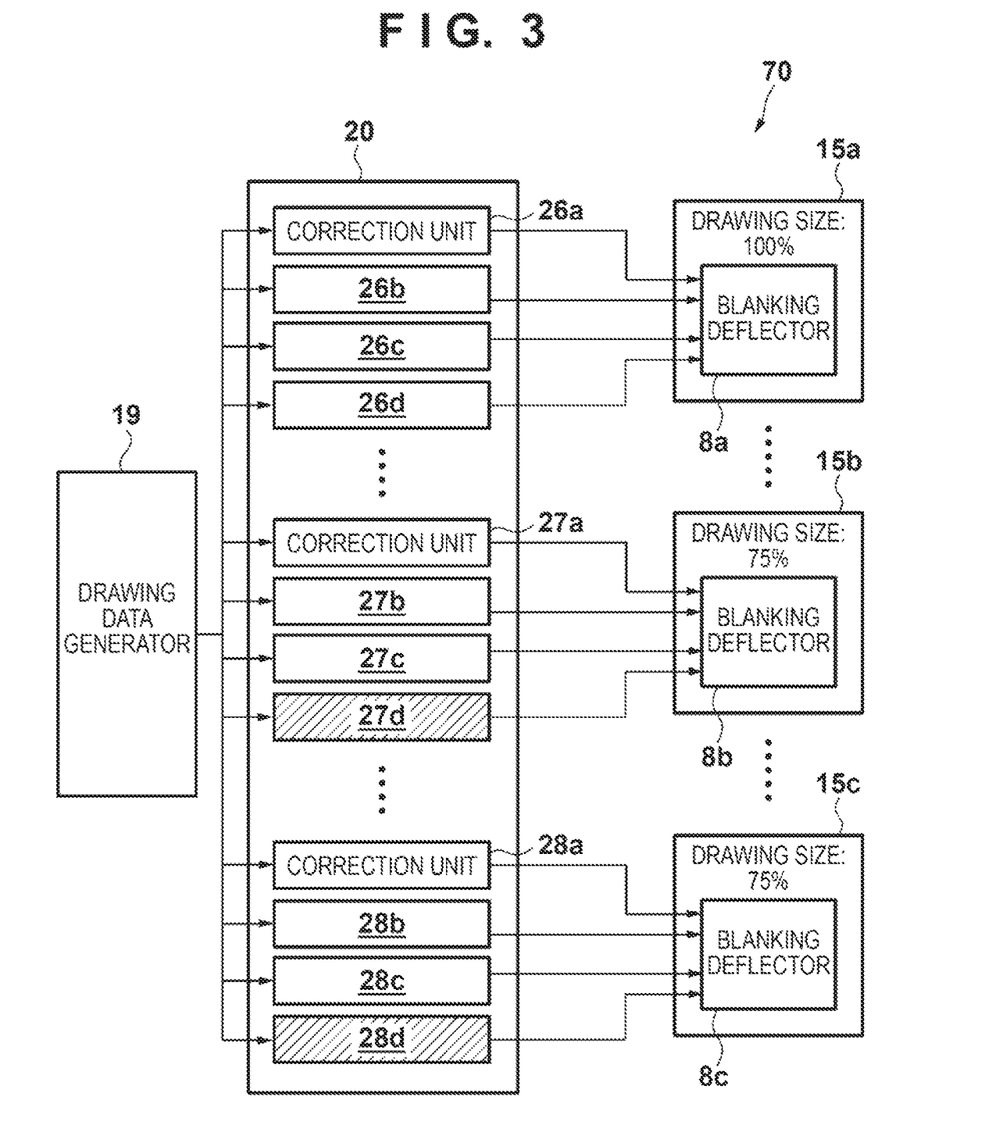
FIG. 3 is a block diagram of a data processing system in a conventional drawing system.

Like the drawing system 60 according to this embodiment, a drawing system including a plurality of drawing apparatuses 15 has been proposed in Japanese Patent No. 3079514. FIG. 3 is a block diagram for a data processing system in the conventional drawing system disclosed in Japanese Patent No. 3079514. In a conventional drawing system 70, a plurality of drawing apparatuses 15a, 15b, and 15c and a first correction processor 20 are arranged, and the respective drawing apparatuses perform drawing processes in parallel. The first correction processor 20 includes a plurality of first correction units 26a to 28d, each of which corrects the irradiation position of a charged particle beam used in the corresponding one of the drawing apparatuses 15a, 15b, and 15c, based on drawing data input to it. A blanking deflector 8a of the first drawing apparatus 15a is connected to the first correction units 26a to 26d in the correction processor 20 via the blanking controller 21. Similarly, blanking deflectors 8b and 8c of the second drawing apparatus 15b and third drawing apparatus 15c are connected to the first correction units 27a to 27d and 28a to 28d, respectively, via the blanking controller 21. Note that FIG. 3 shows a drawing system 70 including an array of three drawing apparatuses 15, and shows none of the controller 16, lens control circuits 17 and 18, deflection signal generation circuit 22, blanking controller 21, deflection amplifier 23, and deflection controller 24. Also, four correction units are required to draw a pattern with a maximum drawing size (100%) that one drawing apparatus 15 can draw, so the size of the drawing area (drawing size) and the number of required correction units in drawing a pattern on the substrate 13 are proportional to each other.

Figure 4A:
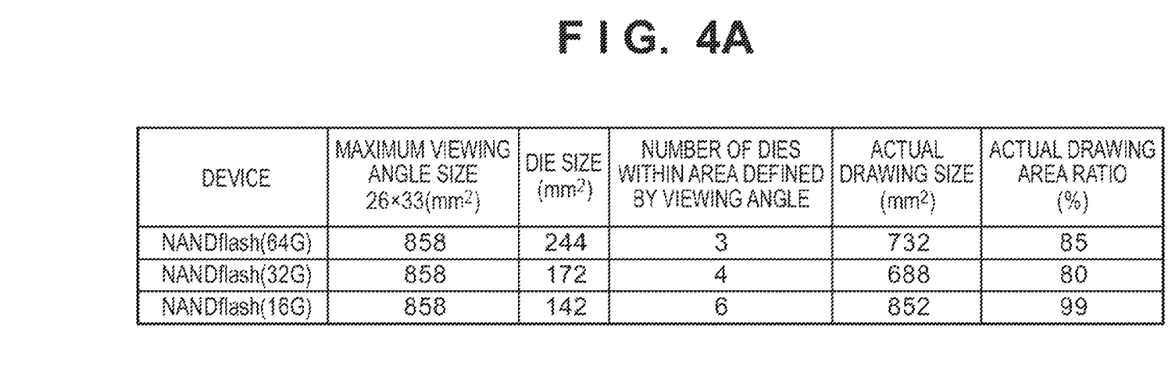
FIG. 4A is a table showing the relationship between the drawing size and the die size of a NAND flash.

The drawing size will be described herein by taking a NAND flash as an example. FIG. 4A shows the relationship between the drawing size and the die size of a NAND flash. As the die size reduces, a larger number of chips can be manufactured from one silicon wafer, so the manufacturing cost of chips lowers. However, with the recent increase in storage capacity, the die size is increasing. The maximum drawing size (26 mm×33 mm) is an upper limit agreed upon in the semiconductor industry in order to prevent rise in apparatus cost.

Figure 4B:
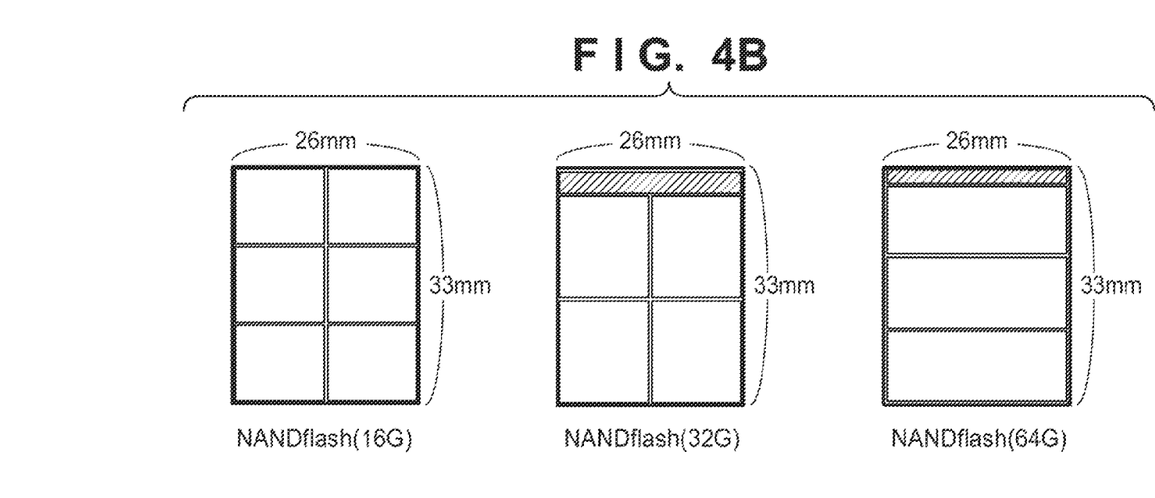
FIG. 4B illustrates views of examples of the layouts of NAND flashes within areas defined by the viewing angle.

FIG. 4B illustrates examples of the layouts of NAND flashes within areas defined by the viewing angle. In a 16-GB NAND flash, the die size is 142 mm$^2$, so six dies can be arranged within an area having the maximum drawing size, that is, they account for 99% of the maximum drawing size. On the other hand, in a 32-GB NAND flash, only four dies can be arranged within an area having the maximum drawing size, that is, they account for 80% of the maximum drawing size, so the hatched area goes wasted. Similarly, in a 64-GB NAND flash, only three dies can be arranged within an area having the maximum drawing size, that is, they account for 85% of the maximum drawing size, so the hatched area goes wasted as well. In the drawing system 70 including the plurality of drawing apparatuses 15, the respective drawing apparatuses 15 normally draw patterns with different drawing sizes in this way, so all drawing apparatuses rarely draw patterns with a maximum drawing size.

Referring to FIG. 3, the first drawing apparatus 15a draws a pattern with the maximum drawing size (100%), while the second drawing apparatus 15b and third drawing apparatus 15c draw patterns with a drawing size of 75% of the maximum drawing size. The blanking deflector 8a of the first drawing apparatus 15a which draws a pattern with the maximum size (100%) corrects drawing data using all the first correction units 26a to 26d. On the other hand, because the second drawing apparatus 15b and third drawing apparatus 15c draw patterns with a drawing size of only 75% of the maximum drawing size, the first correction units 27d and 28d indicated by the hatched portions are unused and unnecessary. In this manner, when patterns are drawn with a drawing size smaller than the maximum drawing size, some correction units are unused and wasted. Hence, in the first embodiment of the present invention, correction units in a number required for each of the drawing apparatuses 15a, 15b, and 15c are provided based on the drawing size that it draws, thereby reducing the number of correction units unused.

Figure 1:
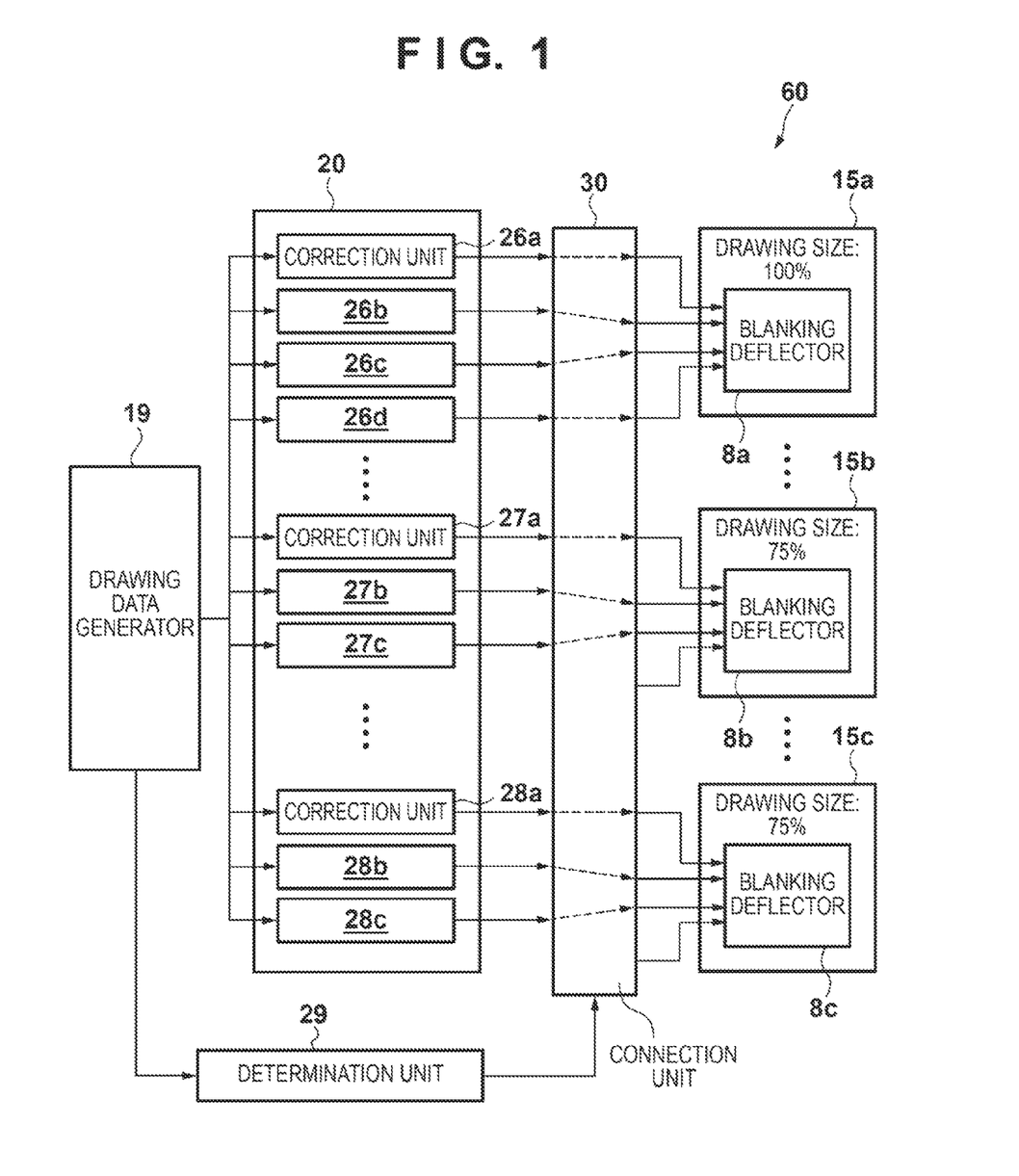
FIG. 1 is a block diagram of a data processing system in a drawing system according to the first embodiment.

FIG. 1 is a block diagram of a data processing system in a drawing system according to the first embodiment. In a drawing system 60 of the first embodiment, a plurality of drawing apparatuses 15a, 15b, and 15c and a correction processor 20 are arranged, and the correction processor 20 includes a plurality of first correction units (first processors) 26a to 28c. Unlike the conventional drawing system 70, the drawing system 60 is not provided with first correction units 27d and 28d, and is newly provided with a determination unit (information processor) 29 and a connection unit 30.

Each of the first correction units 26a to 28c in the first embodiment is selectively connectable to the corresponding one of the drawing apparatuses 15a, 15b, and 15c. As long as the information of the drawing size of a pattern to be drawn by each of the drawing apparatuses 15a, 15b, and 15c is obtained in advance, the amount of processing required in the entire drawing system 60 can be estimated, thereby obtaining the number of correction units required in the entire drawing system 60. The determination unit (information processor) 29 is implemented by an information processing apparatus such as a computer, and specifies the drawing size at which each of the drawing apparatuses 15a, 15b, and 15c draws a pattern on a substrate 13, based on drawing data input to it. The connection relation between each of the first correction units 26a to 28c and the corresponding one of the drawing apparatuses 15a, 15b, and 15c is determined based on the specified drawing size. The connection unit 30 includes a switch circuit which switches the connecting port between the input and output ports, and connects each of the first correction units 26a to 28c to the corresponding one of the drawing apparatuses 15a, 15b, and 15c, based on the connection relation determined by the determination unit 29.

Referring to FIG. 1, the first drawing apparatus (first drawing unit) 15a draws a pattern with the maximum drawing size (100%), while the second drawing apparatus (second drawing unit) 15b and third drawing apparatus (third drawing unit) 15c draw patterns with a drawing size of 75% of the maximum drawing size. The determination unit 29 obtains the number of correction units required for the blanking deflector 8a of the first drawing apparatus 15a, based on the drawing size at which the first drawing apparatus 15a draws a pattern on the substrate 13. In this case, the first drawing apparatus 15a requires four correction units as it draws a pattern with the maximum drawing size. The determination unit 29 determines first correction units to be connected to the first drawing apparatus 15a from the plurality of first correction units 26a to 28c in accordance with the obtained number of correction units. Similarly, the determination unit 29 obtains the numbers of correction units required for the blanking deflectors 8b and 8c of the second drawing apparatus 15b and third drawing apparatus 15c based on the drawing sizes of the second drawing apparatus 15b and third drawing apparatus 15c. Each of the second drawing apparatus 15b and third drawing apparatus 15c requires three correction units as they draw patterns with a drawing size of 75% of the maximum drawing size. The determination unit 29 determines first correction units to be connected to the second drawing apparatus 15b and third drawing apparatus 15c from the plurality of first correction units 26a to 28c in accordance with the obtained numbers of correction units. The connection unit 30 connects the blanking deflector 8a of the first drawing apparatus 15a to the first correction units 26a to 26d based on the determination result obtained by the determination unit 29. Similarly, the connection unit 30 connects the second drawing apparatus 15b to the first correction units 27a to 27c, and the third drawing apparatus 15c to the first correction units 28a to 28c. In this manner, in the drawing system 60, each of the first correction units 26a to 28c can be connected to the corresponding one of the drawing apparatuses 15a, 15b, and 15c in accordance with the number of correction units required for it. Hence, in the drawing system 60, the first correction processor 20 can be formed by first correction units in a number smaller than the number of correction units required to draw a pattern with the maximum drawing size that each drawing apparatus can draw. Note that the number of correction units required to draw a pattern with the maximum drawing size that each drawing apparatus can draw corresponds to the number of correction units which form the first correction processor of the conventional drawing system 70. This is because all drawing apparatuses rarely draw patterns with the maximum drawing size, so the first correction processor 20 can be formed by a minimum total number of first correction units required for each drawing apparatus. Therefore, the drawing system 60 wastes only a small number of correction units that become unnecessary unless the conventional drawing system 70 draws a pattern with the maximum drawing size. In other words, the drawing system 60 can form a correction processor 20 more advantageous in terms of, for example, cost than the conventional drawing system 70. Note that when only patterns with the maximum drawing size (100%) are to be drawn, this can be done by stopping the operations of several drawing apparatuses, and allocating, to operating correction units, correction units in a number corresponding to the number of correction units used in these drawing apparatuses. Control data input to the blanking controller 21 which controls the blanking deflectors 8 has been taken as an example of the drawing data in this embodiment. However, the drawing data may be implemented as control data input to the deflection controller 24 which controls the deflectors 11 for scanning the charged particle beams 4 on the substrate 13.

Figure 5A:
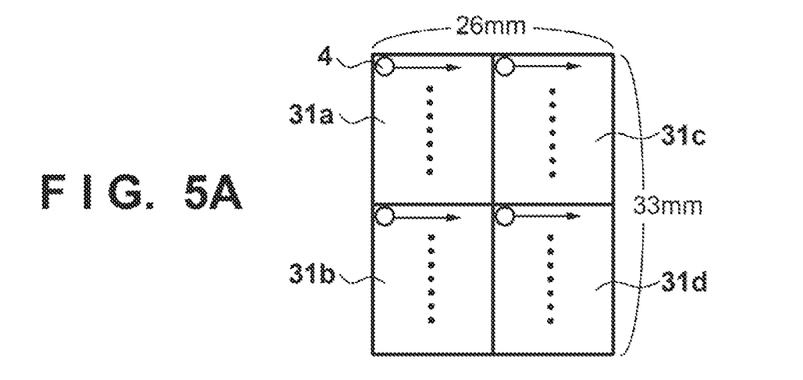
FIG. 5A is a view illustrating an example in which a drawing area is divided into four areas to draw patterns with four charged particle beams.
Figure 5B:
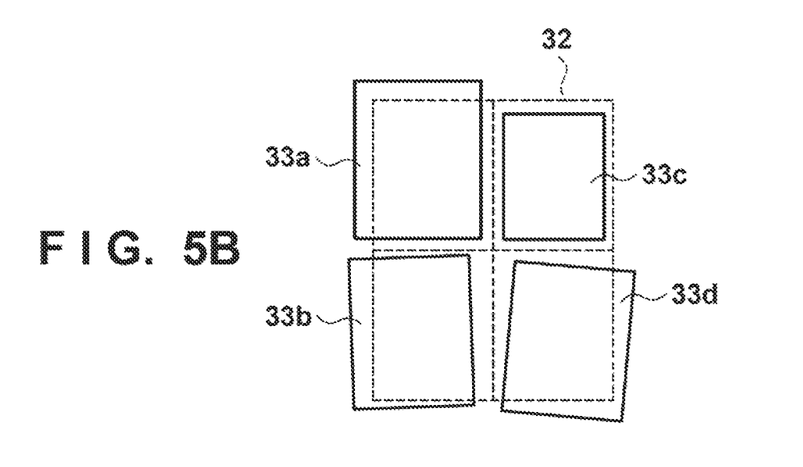
FIG. 5B is a view illustrating an example of the drawing result due to variations in deflection characteristics of the respective split charged particle beams.
Figure 5C:
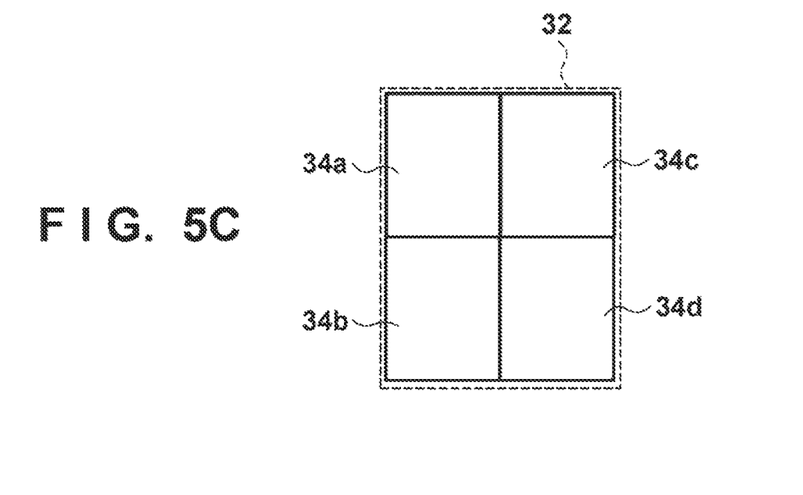
FIG. 5C is a view illustrating an example of the drawing result when drawing data is corrected for each split charged particle beam.

Practical processing details in the correction unit will be explained by taking, as an example, correction of the deflectors 11 for scanning the charged particle beams 4 on the substrate 13. FIG. 5A illustrates an example in which the maximum drawing size (26 mm×33 mm) is divided into four areas to draw patterns with four charged particle beams 4. The deflector 11 is provided to each split charged particle beam 4, is allocated with a correction unit, and is then used to draw a pattern. The charged particle beams 4 are repeatedly deflected by the deflectors 11 in directions indicated by arrows, and used to draw patterns in divided, viewing angle areas 31a to 31d, respectively, as the stage 14 continuously moves the substrate 13. Because the four charged particle beams 4 have displacements from their target irradiation positions due to their aberrations, a displacement occurs with respect to a target grid 32 indicated by dotted lines when drawing is done without correcting the displacements of the charged particle beams 4, as in drawing patterns 33a to 33d before correction shown in FIG. 5B. To prevent this problem, each correction unit performs displacement correction (shift and rotation) and magnification correction (enlargement and reduction) for the drawing data. As a result, patterns can be drawn along the target grid 32 indicated by dotted lines, as in corrected drawing patterns 34a to 34d shown in FIG. 5C. Note that proximity effect correction and beam intensity correction, for example, may be added to the above-mentioned series of correction operations.

Second Embodiment

Figure 6:
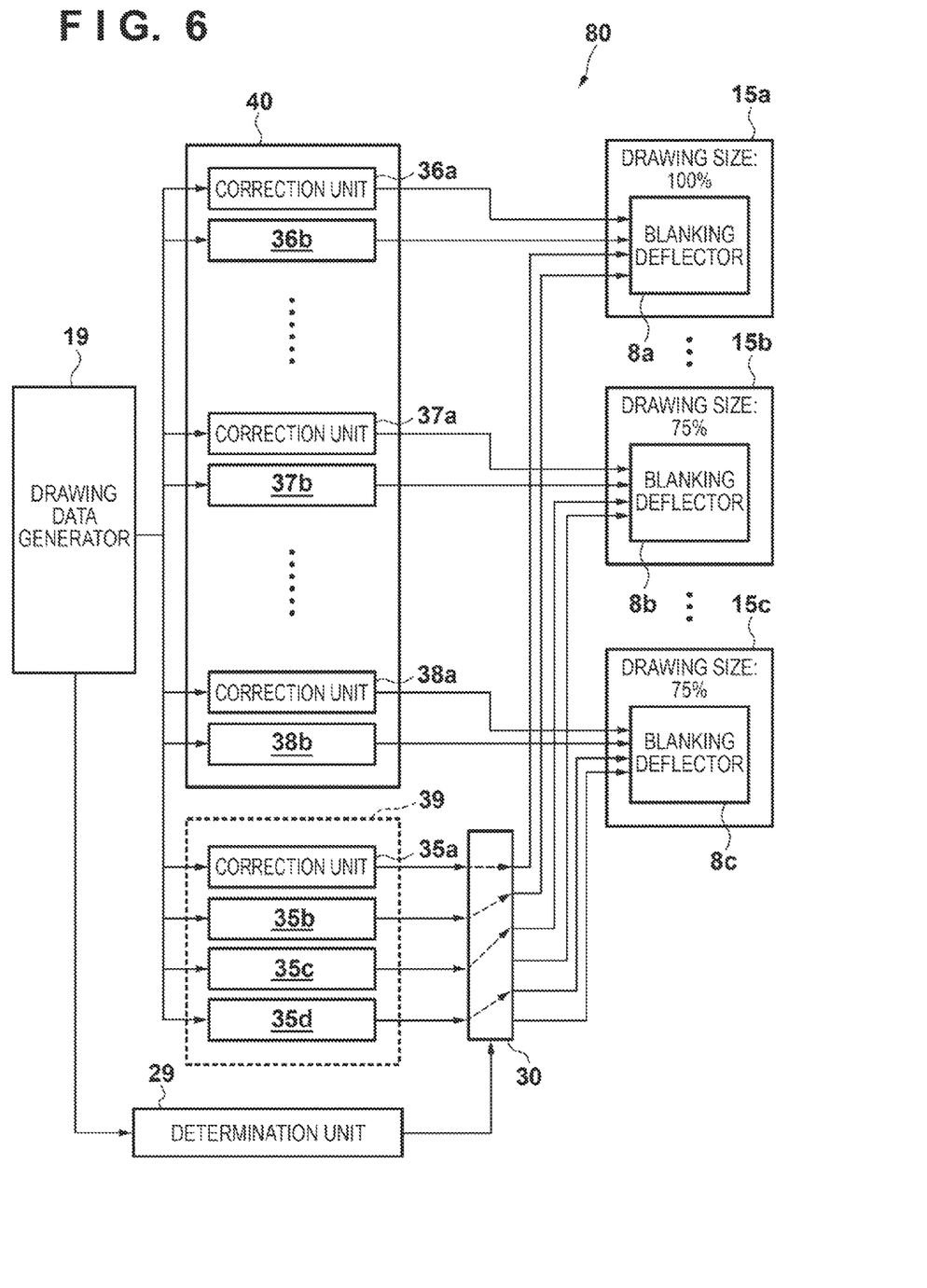
FIG. 6 is a block diagram of a data processing system in a drawing system according to the second embodiment.

FIG. 6 is a block diagram of a data processing system in a drawing system according to the second embodiment. Unlike the drawing system 60 in the first embodiment, a drawing system 80 in the second embodiment is provided with a first correction processor 39 and second correction processor 40. The first correction processor 39 includes first correction units 35a to 35d, each of which is selectively connectable to the corresponding one of drawing apparatuses 15a, 15b, and 15c. Also, the second correction processor 40 includes second correction units (second processors) 36a to 38b, each of which is permanently connected to the corresponding one of the drawing apparatuses 15a, 15b, and 15c. Each of the second correction units 36a to 38b in the second correction processor 40 is connected to the corresponding one of the drawing apparatuses 15a, 15b, and 15c so that a predetermined number of correction units are connected to its blanking deflector 8a, 8b, or 8c in advance (two correction units are connected to each blanking deflector in an example shown in FIG. 6). The predetermined number can be determined based on, for example, the average of the drawing sizes that each of the drawing apparatuses 15a, 15b, and 15c is expected to draw. Note that the drawing size that each of the drawing apparatuses 15a, 15b, and 15c can draw upon connection between the predetermined number of second correction units 36a to 38b and the respective drawing apparatuses 15a, 15b, and 15c is set as a threshold. When the drawing size (that is, the size of the drawing area) specified from drawing data in each of the drawing apparatuses 15a, 15b, and 15c exceeds the threshold (tolerance), the first correction units 35a to 35d in the first correction processor 39 are additionally connected to the blanking deflectors 8a, 8b, and 8c by a connection unit 30.

Referring to FIG. 6, the first drawing apparatus 15a draws a pattern with the maximum drawing size (100%), while the second drawing apparatus 15b and third drawing apparatus 15c draw patterns with a drawing size of 75% of the maximum drawing size. A determination unit 29 obtains the number of correction units required for the blanking deflector 8a, 8b, or 8c of the drawing apparatus 15a, 15b, or 15c, based on drawing data generated by a drawing data generator 19. In this case, the first drawing apparatus 15a requires four correction units as it draws a pattern with the maximum drawing size, while each of the second drawing apparatus 15b and third drawing apparatus 15c requires three correction units as they draw patterns with a drawing size of 75% the maximum drawing size. Since the first drawing apparatus 15a is connected to the second correction units 36a and 36b in the second correction processor 40 in advance, the connection unit 30 connects the first correction units 35a and 35b in the first correction processor 39 to the blanking deflector 8a of the first drawing apparatus 15a. Also, since the second drawing apparatus 15b is connected to the second correction units 37a and 37b in the second correction processor 40 in advance, the connection unit 30 connects the first correction unit 35c in the first correction processor 39 to the blanking deflector 8b of the second drawing apparatus 15b. Similarly, the first correction unit 35d is connected to the blanking deflector 8c of the third drawing apparatus 15c. In this manner, the drawing system 80 obtains the number of correction units deficient when only the second correction units 36a to 38b are used, for each of the drawing apparatuses 15a, 15b, and 15c in accordance with the number of correction units required for it. Then, each of the first correction units 35a to 35d is connected to the corresponding one of the drawing apparatuses 15a, 15b, and 15c in accordance with the numbers of deficient correction units. Hence, the same effect as in the first embodiment can be obtained in the drawing system 80. That is, the first correction processor 39 and second correction processor 40 can be configured so that the sum of the number of first correction units and the number of second correction units becomes smaller than the number of correction units required to draw a pattern with the maximum drawing size that each drawing apparatus can draw.

Figure 7:
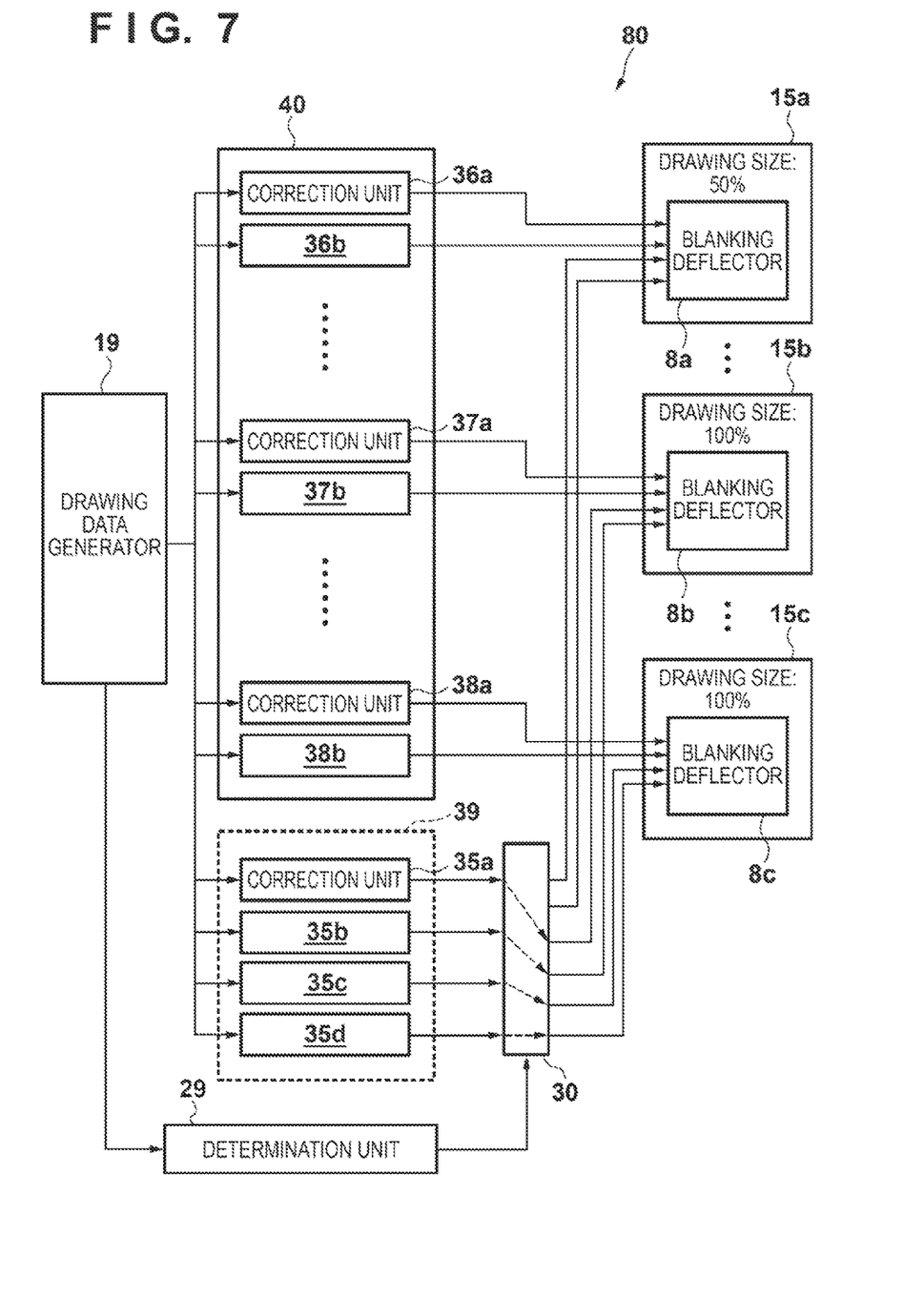
FIG. 7 is a block diagram showing another data processing system in the drawing system according to the second embodiment.

An example in which the drawing size of each of the drawing apparatuses 15a, 15b, and 15c has changed will be given. In the example shown in FIG. 6, the drawing sizes of the first drawing apparatus 15a, second drawing apparatus 15b, and third drawing apparatus 15c are 100%, 75%, and 75%, respectively. FIG. 7 shows the case wherein the drawing sizes of the first drawing apparatus 15a, second drawing apparatus 15b, and third drawing apparatus 15c have changed to 50%, 100%, and 100%, respectively. In this case, the first drawing apparatus 15a requires two correction units as it draws a pattern with a drawing size of 50% of the maximum drawing size, while each of the second drawing apparatus 15b and third drawing apparatus 15c requires four correction units as they draw patterns with the maximum drawing size. Since the first drawing apparatus 15a is connected to the second correction units 36a and 36b in the second correction processor 40 in advance, it need not be connected to any of the first correction units in the first correction processor 39. On the other hand, each of the second drawing apparatus 15b and third drawing apparatus 15c is connected to only two second correction units in the second correction processor 40. Therefore, the first correction units 35a and 35b in the first correction processor 39 are connected to the blanking deflector 8b of the second drawing apparatus 15b, while the first correction units 35c and 35d are connected to the blanking deflector 8c of the third drawing apparatus 15c. In this manner, in the drawing system 80 of the second embodiment, even when the drawing size of each of the drawing apparatuses 15a, 15b, and 15c has changed, appropriate drawing operations can flexibly be done by switching between the first correction units 35a to 35d in the first correction processor 39.

Figure 8A:
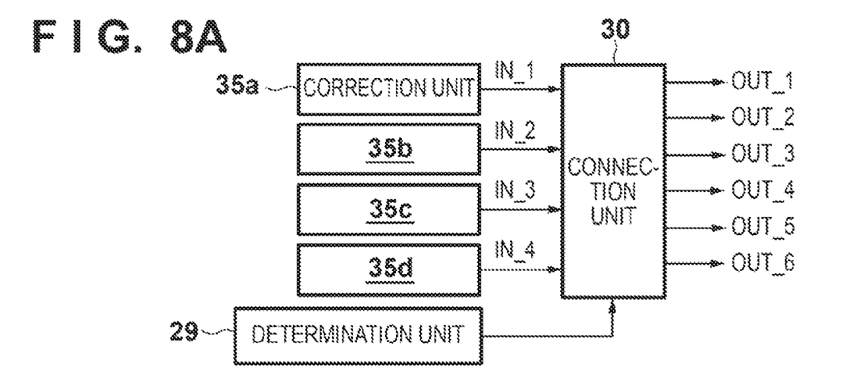
FIG. 8A is a peripheral block diagram of a connection unit in the second embodiment.
Figure 8B:
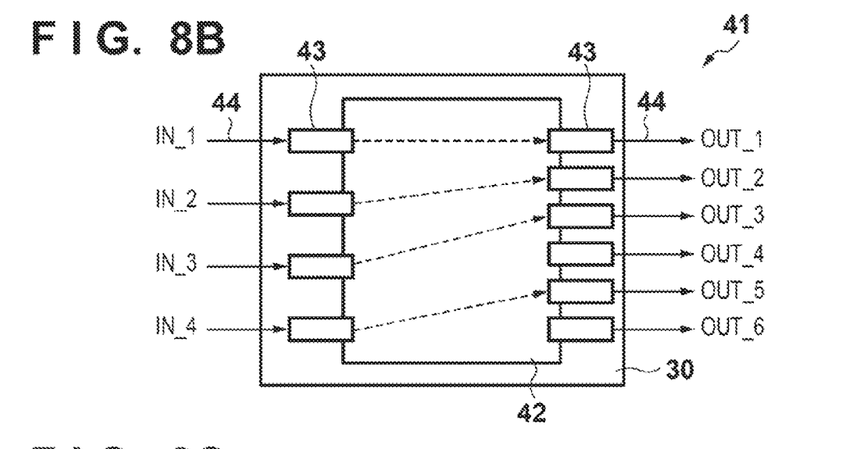
FIG. 8B is a block diagram showing a switch circuit which uses metal cables.
Figure 8C:
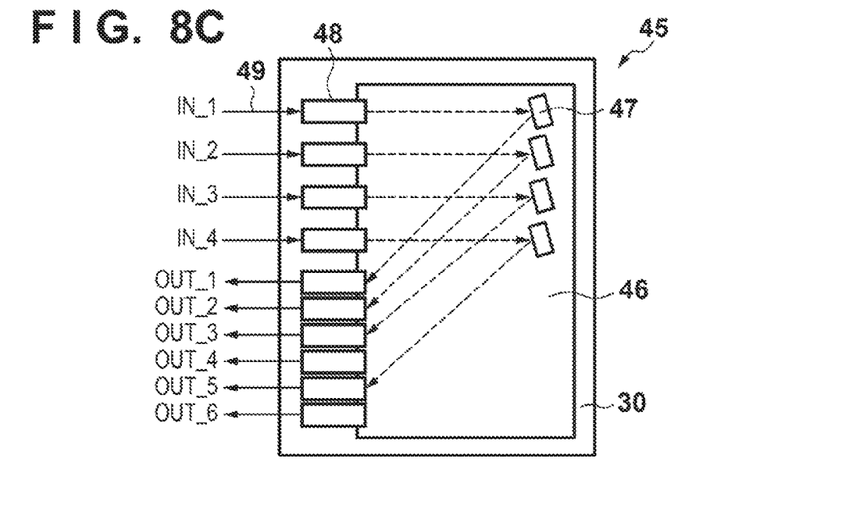
FIG. 8C is a block diagram showing a switch circuit which uses optical fibers.

The connection unit 30 will be described herein. FIG. 8A is a peripheral block diagram of a connection unit in the second embodiment. In the connection unit 30 of the second embodiment, six connection destinations are present for four first connection units, so a four-input, six-output switch circuit, as shown in FIG. 8A, is necessary. FIGS. 8B and 8C illustrate practical examples of this switch circuit.

A switch circuit 41 shown in FIG. 8B includes a switch element 42, coaxial connectors 43, and metal cables 44. Such a switch circuit 41 is used when the communication rate of a signal (drawing data in this embodiment) mainly from the input port (IN) is low. The switch element 42 is compatible with a multiple-input, multiple-output electrical signal, and is commercially available at a relatively low cost.

A switch circuit 45 shown in FIG. 8C includes an optical switch element 46, optical connectors 48, and optical fibers 49. Such a switch circuit 45 is used when the communication rate of a signal (drawing data in this embodiment) mainly from the input port (IN) is high. In the optical switch element 46, light which bears the information of an optical signal input from the input port (IN) is guided to a predetermined output port (OUT) while its reflection angle is controlled by a reflecting mirror 47. With the recent advance in optical MEMS (Micro Electro Mechanical System) technology, a high-density reflecting mirror 47 can be fabricated, so the conventional large-scale optical switch element 46 can be downsized.

<Embodiment of Method of Manufacturing Article>

A method of manufacturing an article according to an embodiment of the present invention is suitable for manufacturing various articles including a microdevice such as a semiconductor device and an element having a microstructure. This method includes a step of forming a latent image pattern on a photosensitive agent, applied on a substrate, using the above-mentioned drawing apparatus (a step of performing drawing on a substrate), and a step of developing the substrate having the latent image pattern formed on it in the forming step. This method also includes subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-002476 filed on Jan. 10, 2012, which is hereby incorporated by reference herein in its entirety.

What is claimed is:

1. A drawing apparatus including a plurality of drawing units each of which is configured to perform drawing on a substrate with a charged particle beam, the apparatus comprising:
   a plurality of first processors configured to be selectively connectable to each of the plurality of drawing units;
   an information processor configured to determine, from the plurality of first processors, a first processor to be connected to a first drawing unit among the plurality of drawing units, based on drawing data; and
   a connection unit configured to connect the determined first processor to the first drawing unit.

2. The apparatus according to claim 1, wherein the determined first processor is configured to correct the drawing data.

3. The apparatus according to claim 1, wherein the information processor is configured to determine the first processor to be connected to the first drawing unit, based on a size of a drawing area corresponding to the drawing data.

4. The apparatus according to claim 3, further comprising:
   a plurality of second processors respectively connected to the plurality of drawing units,
   wherein the determination unit is configured to determine the first processor to be connected to the first drawing unit if the size of the drawing area exceeds a tolerance associated with the second processor.

5. The apparatus according to claim 1, wherein
   each of the plurality of drawing units includes a deflector configured to blank the charged particle beam, and
   the drawing data includes control data for the deflector.

6. The apparatus according to claim 1, wherein
   each of the plurality of drawing units includes a deflector configured to scan the charged particle beam on the substrate, and
   the drawing data includes control data for the deflector.

7. A method of manufacturing an article, the method comprising:
   performing drawing on a substrate using a drawing apparatus;
   developing the substrate on which the drawing has been performed; and
   processing the developed substrate to manufacture the article,
   wherein the drawing apparatus includes a plurality of drawing units each of which is configured to perform drawing on a substrate with a charged particle beam, the apparatus including:
   a plurality of first processors configured to be selectively connectable to each of the plurality of drawing units;
   an information processor configured to determine, from the plurality of first processors, a first processor to be connected to a first drawing unit among the plurality of drawing units, based on drawing data; and
   a connection unit configured to connect the determined first processor to the first drawing unit.

8. An information processing apparatus connected to a drawing apparatus including a plurality of drawing units each of which is configured to perform drawing on a substrate with a charged particle beam, the drawing apparatus including a plurality of first processors configured to be selectively connectable to each of the plurality of drawing units, and a connection unit configured to connect one of the plurality of first processors to one of the plurality of drawing units, wherein the information processing apparatus is configured to
   determine, from the plurality of first processors, a first processor to be connected to a first drawing unit among the plurality of drawing units, based on drawing data, and
   control the connection unit so that the determined first processor is connected to the first drawing unit.

* * * * *